United States Patent [19]

Yoshizumi

[11] Patent Number: 4,747,037
[45] Date of Patent: May 24, 1988

[54] HIGH-VOLTAGE THYRISTOR CONVERSION/INVERSION APPARATUS

[75] Inventor: Toshiaki Yoshizumi, Hyogo, Japan

[73] Assignee: Mitsubishi Denki Kabushiki Kaisha, Tokyo, Japan

[21] Appl. No.: 800,648
[22] PCT Filed: May 8, 1985
[86] PCT No.: PCT/JP85/00254
§ 371 Date: Nov. 1, 1985
§ 102(e) Date: Nov. 1, 1985
[87] PCT Pub. No.: WO85/05233
PCT Pub. Date: Nov. 21, 1985

[30] Foreign Application Priority Data

May 8, 1984 [JP] Japan .................................. 59-93499

[51] Int. Cl.[4] .............................................. H02H 7/125
[52] U.S. Cl. ........................................ 363/54; 361/385; 361/121
[58] Field of Search .......................... 363/53, 54, 68; 361/381, 382, 385, 2, 115, 120, 121, 129, 130

[56] References Cited

FOREIGN PATENT DOCUMENTS

| 197803 | 3/1978 | Fed. Rep. of Germany ...... 363/141 |
| 5147578 | 6/1973 | Japan . |
| 5338027 | 1/1974 | Japan . |
| 5845243 | 9/1975 | Japan . |
| 162880 | 12/1980 | Japan .................................. 361/382 |

OTHER PUBLICATIONS

"Development of HVDC Thyristor Valve Insulated & Cooled by Compressed $SF_6$ Gas", S. Matsumura et al., IEEE 1983, 83 WM 170-8.
"Gas Insulated HVDC Converter Stations", F. E. Fischer et al., World Electrotechnical Congress, USSR, Jun. 21-25, 1977.

Primary Examiner—Patrick R. Salce
Assistant Examiner—Judson H. Jones
Attorney, Agent, or Firm—Wenderoth, Lind & Ponack

[57] ABSTRACT

The invention relates to a high-voltage thyristor conversion/inversion apparatus wherein alternating current supplied from A.C. buses (R), (S), (T) is converted into direct current through bridge-connected valves (U)–(Z), and direct current supplied from D.C. buses (P), (N) is inverted into alternating current. To the end of eliminating problems in reducing the area of the site of an A.C.-D.C. converting/inverting station still more, among the valves constituting a bridge, those (U), (V), (W) or (X), (Y), (Z) of each portion of three arms to be connected to the D.C. bus (P) or (N) of identical sign and lightning arresters (LA1), (LA2), (LA3) or (LA4), (LA5), (LA6) connected in parallel with the respective valves are received in a single sealed tank (TA), thereby to scale down the whole conversion/inversion apparatus. The apparatus is used in the A.C.-D.C. converting-/inverting station.

1 Claim, 5 Drawing Sheets

HIGH-VOLTAGE THYRISTOR CONVERSION/INVERSION APPARATUS

DESCRIPTION

1. Technical Field

This invention relates to a high-voltage thyristor conversion/inversion apparatus for use in an A.C.-D.C. converting/inverting station etc.

2. Background Art

FIG. 1 is a connection diagram of a high-voltage thyristor conversion/inversion apparatus to which this invention is directed, and by which alternating current supplied from A.C. buses (R), (S) and (T) is converted into direct current through bridge-connected valves (U)-(Z) or direct current supplied from D.C. buses (P) and (N) is inverted into alternating current. (LA1)-(LA6) indicate lightning arresters, which are connected in parallel with the bridge-connected valves (U)-(Z) in order to protect the respective valves (U)-(Z) from overvoltages.

Each of the valves (U)-(Z) constituting the high-voltage thyristor conversion/inversion apparatus is constructed in such a way that thyristor modules (SM), each of which comprises a plurality of thyristor elements (S1)-(Sn) as well as an anode reactor (AL) belonging thereto, and resistors and capacitors as shown in FIG. 2, are stacked in a required number by the use of insulating bars (B) as shown in FIG. 3.

FIG. 4 shows an example of the practicable arrangement of these thyristor valves in a prior art, and depicts a portion corresponding to three arms in a rectifier bridge which is composed of six arms of valves.

The valves (U), (V) and (W) constituting the bridge are respectively received in separate sealed tanks so as to be protected from dust in the air. These sealed tanks are often filled up with, ordinarily, an insulating oil or insulating gas in order to enhance an insulation performance. The A.C. buses (R), (S) and (T) and the D.C. bus (P) are connected to these valves, and the lightning arresters (LA1), (LA2) and (LA3) for protecting the valves are connected in parallel with the valves.

In the prior-art thyristor conversion/inversion apparatus wherein the individual valves (U), (V) and (W) constituting the bridge are received in the separate sealed tanks in this manner, the arrangement becomes large in size, and the A.C. buses and the D.C. buses intersect complicatedly, as illustrated in FIG. 4. These have been problems in reducing the area of the site of an A.C.-D.C. converting/inverting station still more.

DISCLOSURE OF THE INVENTION

This invention consists in constructing a high-voltage thyristor conversion/inversion apparatus in such a way that, among valves constituting a bridge, those of each portion corresponding to three arms, which are connected to a D.C. bus of identical sign, and lightning arresters which are connected in parallel with the respective valves, are received in a single sealed tank, thereby to reduce the size of the whole conversion/inversion apparatus. It has the effect that more reduction in the area of the site of an A.C.-D.C. converting/inverting station and simplification in the construction of the converting/inverting station can be achieved.

BEST MODE FOR CARRYING OUT THE INVENTION

Figure 1:
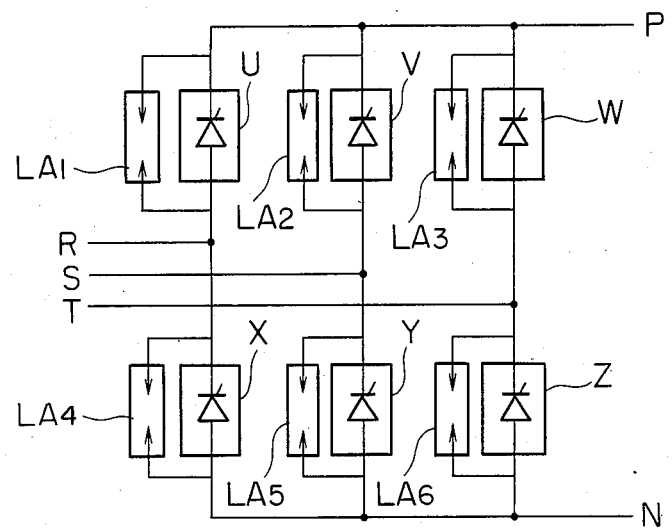
FIG. 1 is a connection diagram of a high-voltage thyristor conversion/inversion apparatus.
Figure 2:
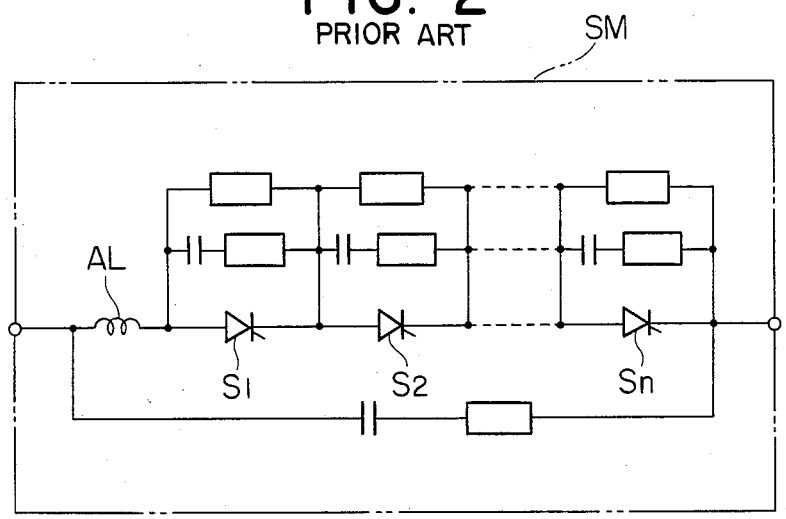
FIG. 2 is a connection diagram of the thyristor module thereof.
Figure 3:
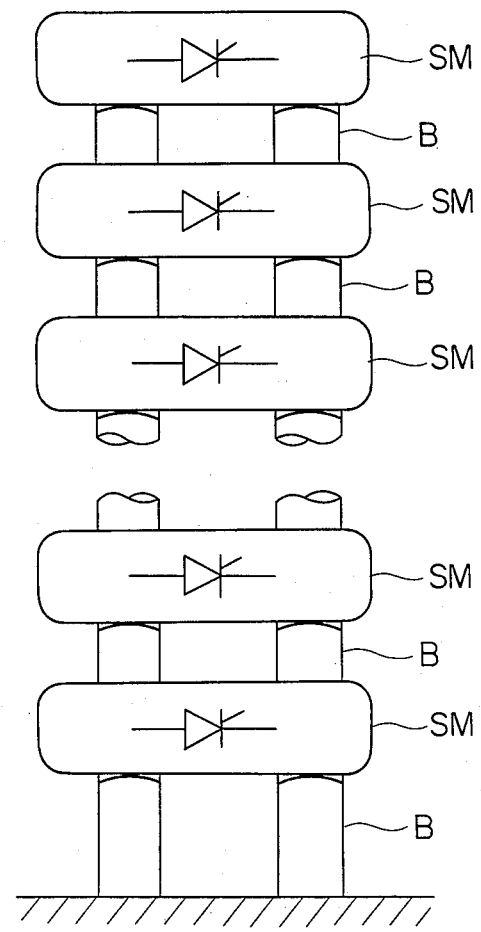
FIG. 3 is a view of the internal setup of each valve.
Figure 4:
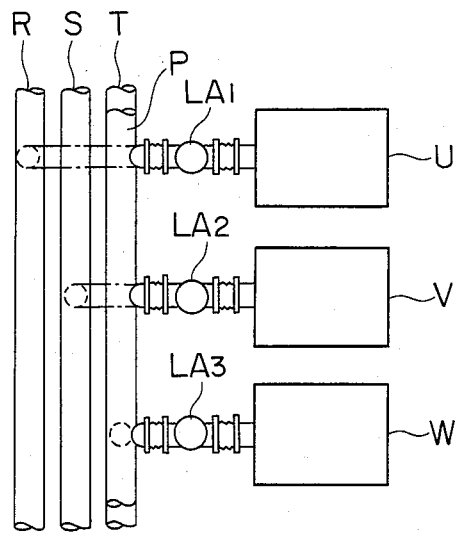
FIG. 4 is an arrangement view of a high-voltage thyristor conversion/inversion apparatus in a prior art.
Figure 4:
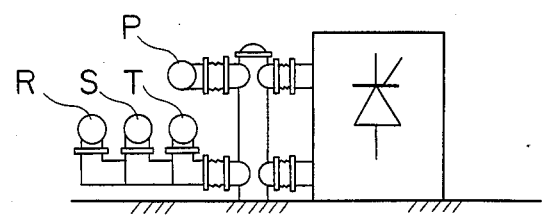
Figure 5:
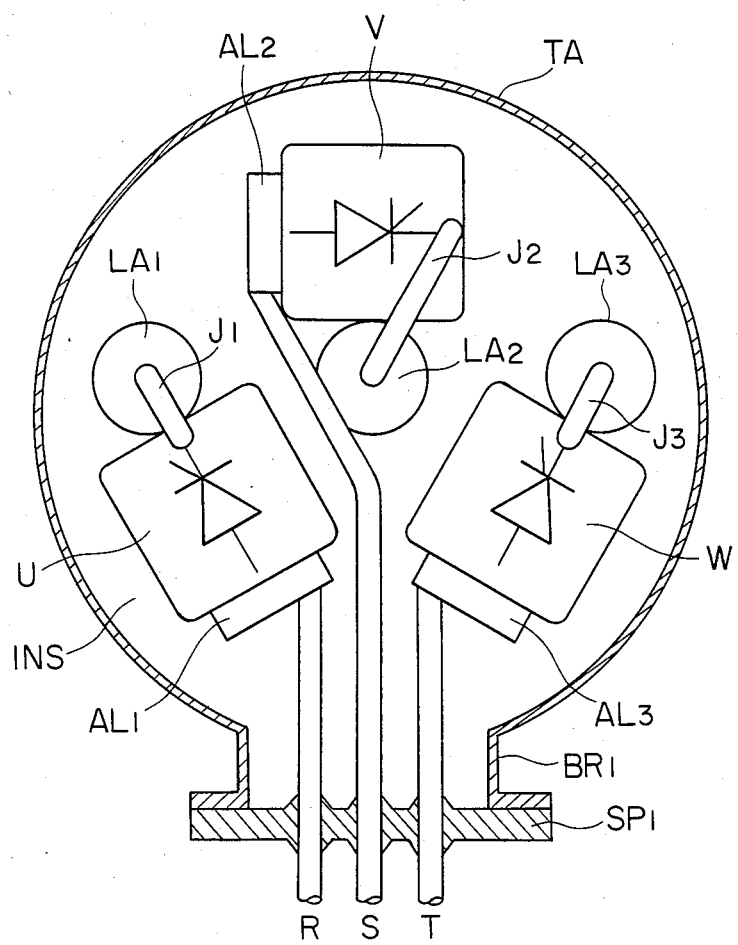
FIGS. 5, 6 and 7 are sectional views all showing a high-voltage thyristor conversion/inversion apparatus in one aspect of performance of this invention.

FIG. 5 is a sectional view in which valves according to this invention are seen from below. Among valves constituting a bridge, those (U), (V) and (W) of a portion corresponding to three arms are collectively received in a cylindrical sealed tank (TA). This tank is filled up with an insulating medium (INS) of high dielectric strength, for example, an insulating oil or insulating gas, with the result that the insulation distances between the sealed tank (TA) and the valves (U), (V) and (W) can be shortened.

The sealed tank (TA) is provided with an opening (BRI) in the shape of a branch pipe, and an insulating spacer (SPI) is mounted on the sealed tank (TA) in a manner to cover up the opening (BRI).

Three-phase A.C. buses (R), (S) and (T) corresponding to three phases are collectively led inwards from outside the sealed tank (TA) while penetrating the insulating spacer (SPI), and are respectively connected to the valves (U), (V) and (W) via anode reactors (AL1), (AL2) and (AL3) each being disposed on one side of the corresponding valve.

In the sealed tank (TA), the valves (U), (V) and (W) are arranged concentrically at equal intervals. Since the section of each valve (U), (V) or (W) usually forms a rectangle as shown in FIG. 5, wasteful spaces arise when the valves corresponding to the three arms are collectively installed inside the sealed tank (TA). By utilizing the spaces, therefore, lightning arresters (LA1), (LA2) and (LA3) juxtaposed to the respective valves (U), (V) and (W) are arrayed in a straight line as shown in the figure, and they are connected in parallel with the respective valves (U), (V) and (W) through joint conductors (J1), (J2) and (J3).

Figure 6:
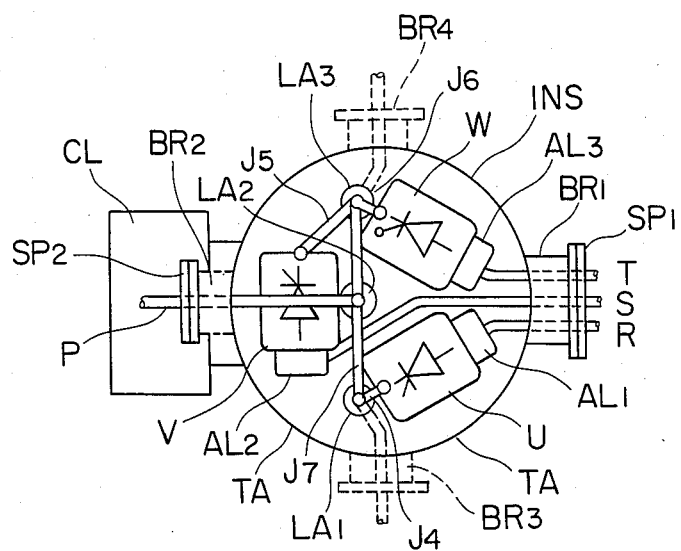

FIG. 6 is a plan view in which the collected valves of the three arms constructed as described above are seen from above, while FIG. 7 is a side view of the same, both the figures depicting sections.

Referring to FIG. 6, (J4), (J5) and (J6) indicate joint conductors which serve to connect the valves (U), (V) and (W) and the lightning arresters (LA1), (LA2) and (LA3) in a top part, and which are collectively coupled to a joint conductor (J7) thereby to be connected to the D.C. bus (P). The D.C. bus (P) is led out of the sealed tank (TA) while penetrating a branch pipe (BR2) and a spacer (SP2) with which the sealed tank (TA) is provided. The branch pipe (BR2) can be mounted in any desired direction as understood from the illustration, and it may well be mounted, for example, on a position (BR3) or (BR4) as indicated by dotted lines in the figure. (CL) denotes a cooling device for cooling the insulating medium (INS) and the valves (U), (V) and (W) inside the sealed tank (TA).

Figure 7:
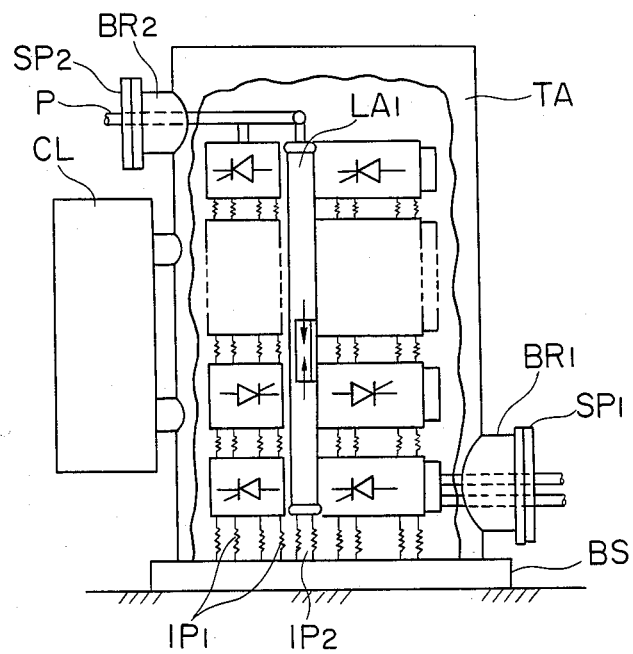

(IP1) and (IP2) indicated in FIG. 7 denote insulating pillars which are fixed on a base (BS), and which support the valves (U), (V) and (W) and the lightning arresters (LA1), (LA2) and (LA3) while insulating them from the sealed tank (TA).

The outgoing ends of the three-phase A.C. buses (R), (S) and (T) and the D.C. bus (P) can be connected directly to a bushing and a cable head, and can also be connected with other equipment by the use of, for example, conduit aerial buses.

In particular, the three-phase A.C. buses (R), (S) and (T) have the three-phase portion collected and can therefore have the A.C. side lead-in end thereof connected directly with conduit aerial buses collected for three phases, so that the construction of a converting-/inverting station can be simplified and scaled down in the extreme.

It is needless to say that the arrangements of the valves (U), (V) and (W) and the lightning arresters (LA1), (LA2) and (LA3) inside the sealed tank (TA) are not restricted to those of the above embodiment, but that they can be variously modified within a scope not changing the purport of this invention. Further, as the sectional shape of the sealed tank (TA), it is possible to employ, not only the circle shown in the drawings, but also an ellipse or a rectangle.

What is claimed is:

1. In a high-voltage thyristor conversion/inversion apparatus wherein a bridge circuit is constructed of valves of six arms and lightning arresters which are connected in parallel with the respective valves; a high-voltage thyristor conversion/inversion apparatus characterized in that the valves and lightning arresters of each portion corresponding to three arms, which are connected to a DC bus of identical sign, are received in a single sealed tank;

wherein said valves are arranged concentrically at equal intervals in said sealed tank and wherein said lightning arresters each of which is disposed on one side of the corresponding valve are arrayed in a straight line.

* * * * *